United States Patent
Jung et al.

(10) Patent No.: US 8,183,896 B2
(45) Date of Patent: May 22, 2012

(54) RESISTIVE FREQUENCY MIXING APPARATUS AND SIGNAL PROCESSING METHOD USING THE SAME

(75) Inventors: Dong Yun Jung, Daejeon (KR); Chul Soon Park, Daejeon (KR)

(73) Assignee: Korea Advanced Institute of Science and Technology (KAIST), Daejeon (KR)

( * ) Notice: Subject to any disclaimer, the term of this patent is extended or adjusted under 35 U.S.C. 154(b) by 707 days.

(21) Appl. No.: 12/289,354

(22) Filed: Oct. 27, 2008

(65) Prior Publication Data
US 2009/0181634 A1    Jul. 16, 2009

(30) Foreign Application Priority Data

Jan. 16, 2008    (KR) ........................ 10-2008-0005011

(51) Int. Cl.
*H03B 19/00*    (2006.01)
(52) U.S. Cl. ........................................ 327/116; 455/333
(58) Field of Classification Search .................. 327/116, 327/119, 120
See application file for complete search history.

(56) References Cited

U.S. PATENT DOCUMENTS

| | | | |
|---|---|---|---|
| 4,592,095 A | | 5/1986 | Ohnishi et al. |
| 4,603,435 A | | 7/1986 | Butler |
| 4,727,597 A | * | 2/1988 | Dautriche .................. 455/333 |
| 5,649,312 A | * | 7/1997 | Kennan .................... 455/333 |
| 5,789,963 A | * | 8/1998 | Sakusabe ................. 327/356 |
| 6,044,255 A | * | 3/2000 | Suematsu et al. ........ 455/333 |
| 6,351,632 B1 | * | 2/2002 | Yan et al. ................ 455/333 |
| 6,388,501 B2 | * | 5/2002 | Chien ..................... 327/355 |
| 6,466,775 B1 | * | 10/2002 | Franca-Neto ............ 455/326 |
| 6,636,114 B2 | * | 10/2003 | Tsutsui et al. ............ 330/51 |
| 6,798,268 B2 | * | 9/2004 | Kim et al. ............... 327/359 |
| 6,892,062 B2 | * | 5/2005 | Lee et al. ............... 455/326 |
| 7,570,936 B2 | * | 8/2009 | Vice ...................... 455/326 |
| 7,693,503 B2 | * | 4/2010 | Su et al. ................ 455/323 |
| 7,840,197 B2 | * | 11/2010 | Mirzaei et al. ........... 455/126 |
| 2001/0033193 A1 | * | 10/2001 | Chien ..................... 327/355 |

(Continued)

FOREIGN PATENT DOCUMENTS

JP    H06-276028    9/1994

(Continued)

OTHER PUBLICATIONS

Fully Integrated 60-GHz Single-Ended Resistive Mixer in 90-nm CMOS Technology, Bahar M. Motlagh, Sten E. Gunnarsson, Mattias Ferndahl, and Herbert Zirath, IEEE Microwave and Wireless Components Letters, vol. 16, No. 1, pp. 25-27, Jan. 2006.
A GaAs MESFET Mixer with Very Low Intermodulation, Stephen A. Maas, IEEE Transactions on Microwave Theory and Techniques, vol. MTT-35, No. 4, pp. 425-429, Apr. 1987.

(Continued)

*Primary Examiner* — Thomas J Hiltunen
(74) *Attorney, Agent, or Firm* — Bacon & Thomas, PLLC

(57) ABSTRACT

A resistive frequency mixing apparatus includes a first frequency mixer having a source follower FET, and a second frequency mixer having a common source FET. The resistive frequency mixing apparatus perform a frequency mixing of an RF depending on an LO signal to generate a down-converted IF signal when the RF signal is applied to the source follower FET and the LO signal is applied to the common source FET. Further, the resistive frequency mixing apparatus performs a frequency mixing of an IF signal depending on an LO signal through the use of the source follower FET to produce an up-converted RF signal when the IF signal is applied to the common source FET and the LO signal is applied to the common source FET.

16 Claims, 4 Drawing Sheets

U.S. PATENT DOCUMENTS

2008/0169859 A1 * 7/2008 Garcia et al. .................. 327/355

FOREIGN PATENT DOCUMENTS

| | | |
|---|---|---|
| JP | H09-294026 | 11/1997 |
| JP | H11-008515 | 1/1999 |
| KR | 10-2005-0042580 | 5/2005 |
| KR | 10-2006-0064980 | 6/2006 |

OTHER PUBLICATIONS

A 60 GHz MMIC Dual-Quadrature Mixer in pHEMT technology for Ultra Wideband IF Signals and High LO to RF Isolation, Sten E. Gunnarsson and Herbert Zirath, IEEE MTT-S Int. Microwave Symp. pp. 1991-1994, Jun. 2005.

* cited by examiner

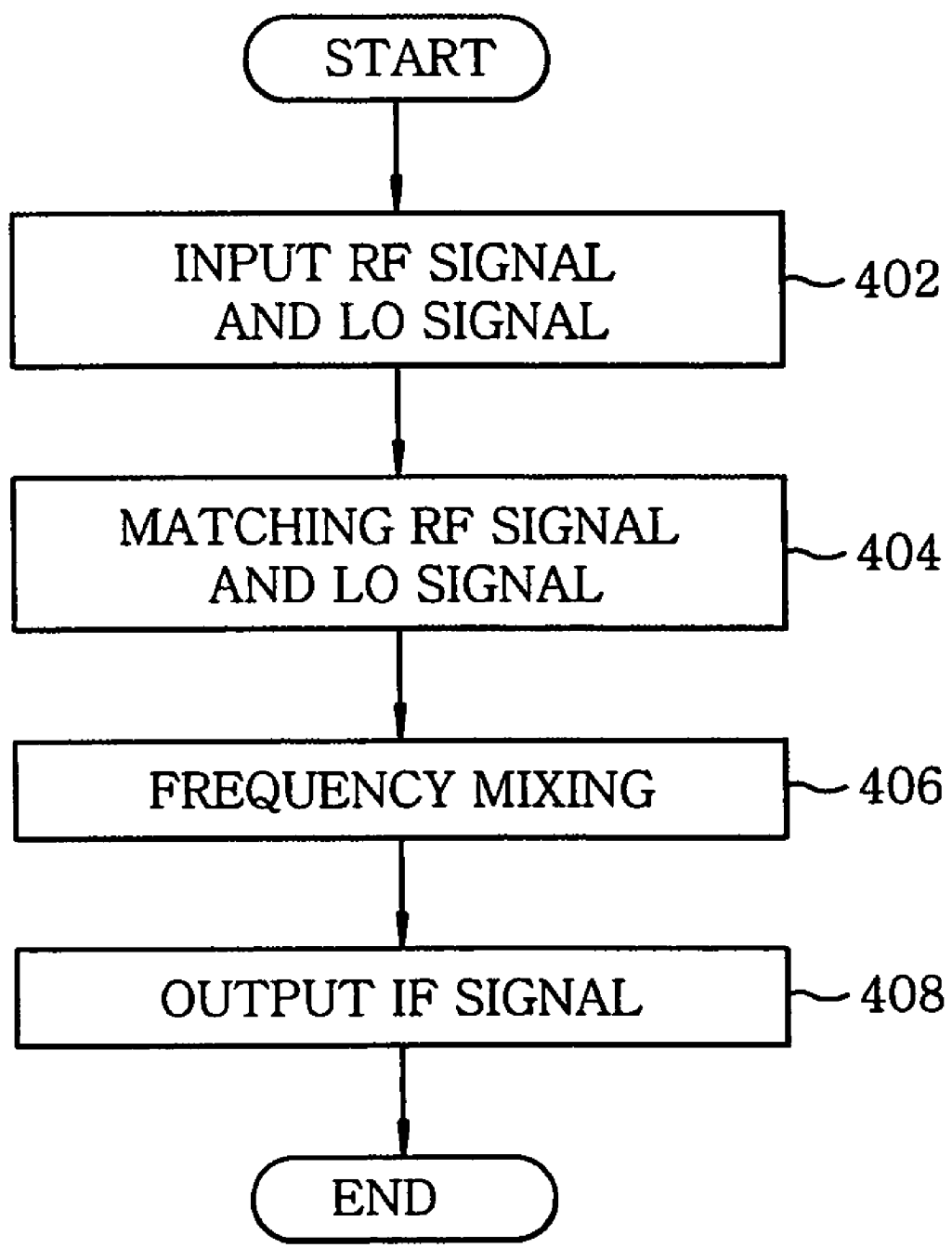

RESISTIVE FREQUENCY MIXING APPARATUS AND SIGNAL PROCESSING METHOD USING THE SAME

FIELD OF THE INVENTION

The present invention relates to a resistive frequency mixing apparatus, and more specifically, to a resistive frequency mixing apparatus which is suitable for converting an input RF (Radio Frequency) signal into an IF (Intermediate Frequency) signal depending on an LO (Local Oscillator) frequency, or vice versa, and a signal processing method using the same.

BACKGROUND OF THE INVENTION

As well-known in the art, an ultra-high speed broadband communication system at a level of Gbps has been required nowadays to deal with an increased amount of data. For example, 60 GHz millimeter-wave band that meets such requirement has drawn a lot of interests. In order to apply such system to a mobile communication terminal, some features such as lower-power consumption, isolation between circuits, and a compact size should be satisfied.

The term of 'isolation' is the criteria showing how much two objects are isolated from each other, and is used as the parameter indicating the degree of inhibition of intrinsic signals of each port from going to the other ports because of the occurrence of interference in every port with respect to an I/O port to or from which the signals are inputted or outputted. For example, since a mixer having three ports such as RF, LO and IF is designed to achieve frequency conversion, it is essential to have port-to-port isolation.

In particular, a resistive frequency mixing apparatus used in a millimeter-wave band in a radio communication system has a structure that an input RF signal is converted into an IF signal depending on an input LO frequency by using FET (Field-Effect Transistor), LO filter, RF filter, or IF filter.

FIG. 1 shows one example of a conventional resistive frequency mixing apparatus, and FIG. 2 presents another example of a conventional resistive mixing apparatus proposed by Chalmers University of Technology in Sweden.

In the resistive frequency mixing apparatus illustrated in FIG. 1, an LO frequency is inputted to a gate of FET 12 via an LO matching circuit 10, an RF signal is applied to a drain of the FET 12 via a matching network including the matching circuit 10 and an RF filter 14, and an IF signal is outputted from a drain of the FET 12 via a matching network including the matching circuit 10 and an IF filter 16.

On the other hand, in the resistive frequency mixing apparatus illustrated in FIG. 2, branch line couplers (or baluns) 21 and 22 are provided at the input ports to receive RF and LO signals in order to improve isolation between RF and LO signals. By these branch line couplers 21 and 22, these input signals are divided into two paths. Therefore, LO frequencies are inputted to gates of two FETs 23 and 24, respectively, via LO filters (not shown). The RF signals separated through the branch line couplers 21 and 22 are connected to drains of the two FETs 23 and 24 via the RF filters 25 and 26, and IF signals are outputted from the drains of the two FETs 23 and 24 via IF filters 27 and 28.

However, since the resistive frequency mixing apparatus as shown in FIG. 1 has the RF input port and the IF output port connected to the drains of the FETs, it is difficult to secure the isolation between the RF and LO signals. Another resistive frequency mixing apparatus as shown in FIG. 2 requires a number of couplers (or baluns) and filters to secure the isolation, thus increasing the size of circuit and requiring relatively large LO power consumption to drive such circuit.

SUMMARY OF THE INVENTION

It is, therefore, an object of the present invention to provide a resistive frequency mixing apparatus which is capable of improving isolation between an RF input port and an LO output port by using a source follower FET and a common source FET, and a signal processing method using the same.

Another object of the present invention is to provide a resistive frequency mixing apparatus, which is capable of providing LO frequency as an input signal at relatively low LO power and providing an IF signal corresponding to an input RF signal as an output signal at relatively low conversion loss, and a signal processing method using the same.

In accordance with a first aspect of the present invention, there is provided a resistive frequency mixing apparatus, which includes:

a first frequency mixer having a source follower FET (Field-Effect Transistor); and a second frequency mixer having a common source FET, wherein the resistive frequency mixing apparatus perform a frequency mixing of an RF (Radio Frequency) depending on an LO (Local Oscillation) signal to generate a down-converted IF (Intermediate Frequency) signal when the RF signal is applied to the source follower FET and the LO signal is applied to the common source FET, and wherein the resistive frequency mixing apparatus performs a frequency mixing of an IF signal depending on an LO signal through the use of the source follower FET to produce an up-converted RF signal when the IF signal is applied to the common source FET and the LO signal is applied to the common source FET.

In accordance with a second aspect of the present invention, there is provided a resistive frequency mixing apparatus, which includes:

a first frequency mixer having a common source FET (Field-Effect Transistor); and a second frequency mixer having a source follower FET, wherein the resistive frequency mixing apparatus perform a frequency mixing of an RF (Radio Frequency) signal depending on an LO (Local Oscillation) signal to provide a down-converted IF (Intermediate Frequency) signal when the RF signal is applied to the common source FET and the LO signal is applied to the source follower FET; and wherein the resistive frequency mixing apparatus performs a frequency mixing of an IF signal depending on an LO signal through the use of the common source FET to output an up-converted RF signal when the IF signal is applied to the source follower FET and the LO signal is applied to the source follower FET.

In accordance with a third aspect of the present invention, there is provided a signal processing method for use in a resistive frequency mixing apparatus including a first frequency mixer having a source follower FET (Field-Effect Transistor), and a second frequency mixer having a common source FET, which includes the steps of:

frequency matching an input RF (Radio Frequency) signal and an input LO (Local Oscillation) signal, respectively;

when the frequency matched RF signal is applied to the source follower FET and the frequency matched LO signal is applied to the common source FET, performing a frequency mixing of the frequency matched RF signal depending on the frequency matched LO signal to generate a down-converted IF (Intermediate Frequency) signal; and when the frequency matched RF signal is applied to the common source FET and the frequency matched LO signal is applied to the source follower FET, carrying out a frequency mixing of the frequency matched RF signal depending on the frequency matched LO signal to produce a down-converted IF signal.

In accordance with a fourth aspect of the present invention, there is provided a signal processing method for use in a resistive frequency mixing apparatus including a first frequency mixer having a common source FET (Field-Effect Transistor), and a second frequency mixer having a source follower FET, the method comprising the steps of:

frequency matching an input IF (Intermediate Frequency) signal and an input LO (Local Oscillation) signal, respectively;

when the frequency matched IF signal and the frequency matched LO signal are applied to the common source FET, performing a frequency mixing of the frequency matched IF signal and the frequency matched LO signal by the source follower FET to generate an up-converted RF (Radio Frequency) signal; and when the frequency matched IF signal and the frequency matched LO signal are applied to the source follower FET, carrying out a frequency mixing of the frequency matched IF signal and the frequency matched LO signal by the common source FET to produce an up-converted IF signal.

BRIEF DESCRIPTION OF THE DRAWINGS

The above and other objects and features of the present invention will become apparent from the following description of preferred embodiments, given in conjunction with the accompanying drawings, in which:

FIG. 4 illustrates a flowchart describing a method for generating an IF signal in a resistive frequency mixing apparatus in accordance with the present invention;

DETAILED DESCRIPTION OF THE PREFERRED EMBODIMENT

As will be discussed below, the present invention proposes that input/output ports of RF signal are connected to a source follower FET or a common source FET, an input port of an LO signal is connected to the common source FET or the source follower FET, and input/output ports of IF signal are connected to the common source FET or the source follower FET. Accordingly, the RF signal is subjected to frequency mixing based on the LO signal to generate a down-converted IF signal, or the IF signal is subjected to frequency mixing based on the LO signal to generate an up-converted RF signal, thereby solving the above-mentioned problems of the prior arts.

Hereinafter, exemplary embodiments of the present invention will be described in detail with reference to the accompanying drawings.

Figure 1:
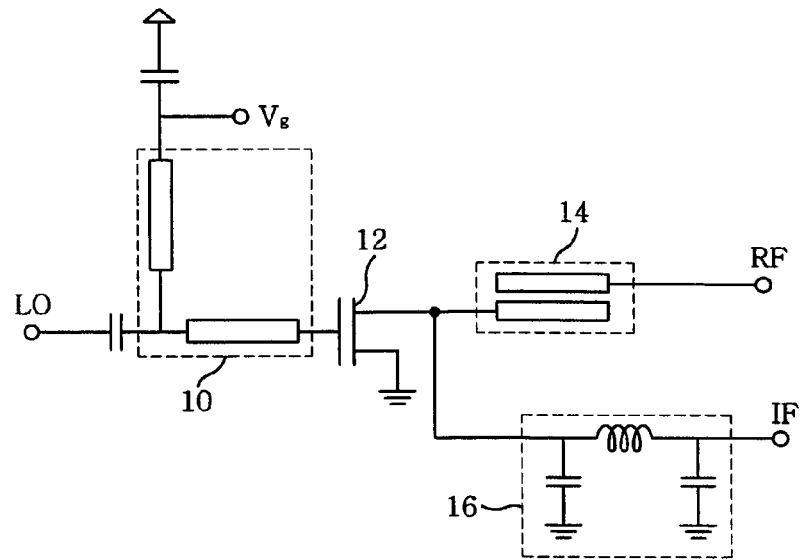
FIG. 1 shows one example of a conventional resistive frequency mixing apparatus.
Figure 2:
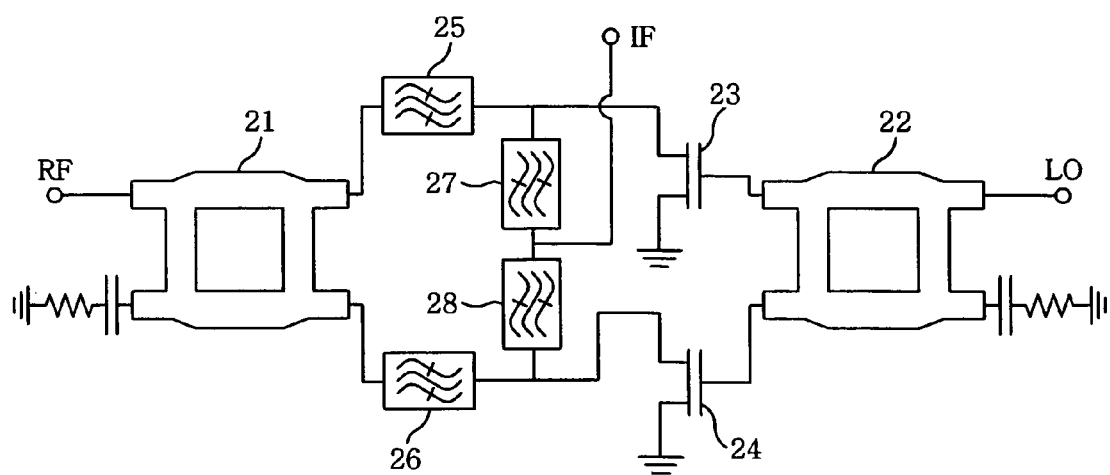
FIG. 2 presents another example of a conventional resistive frequency mixing apparatus.
Figure 3A:
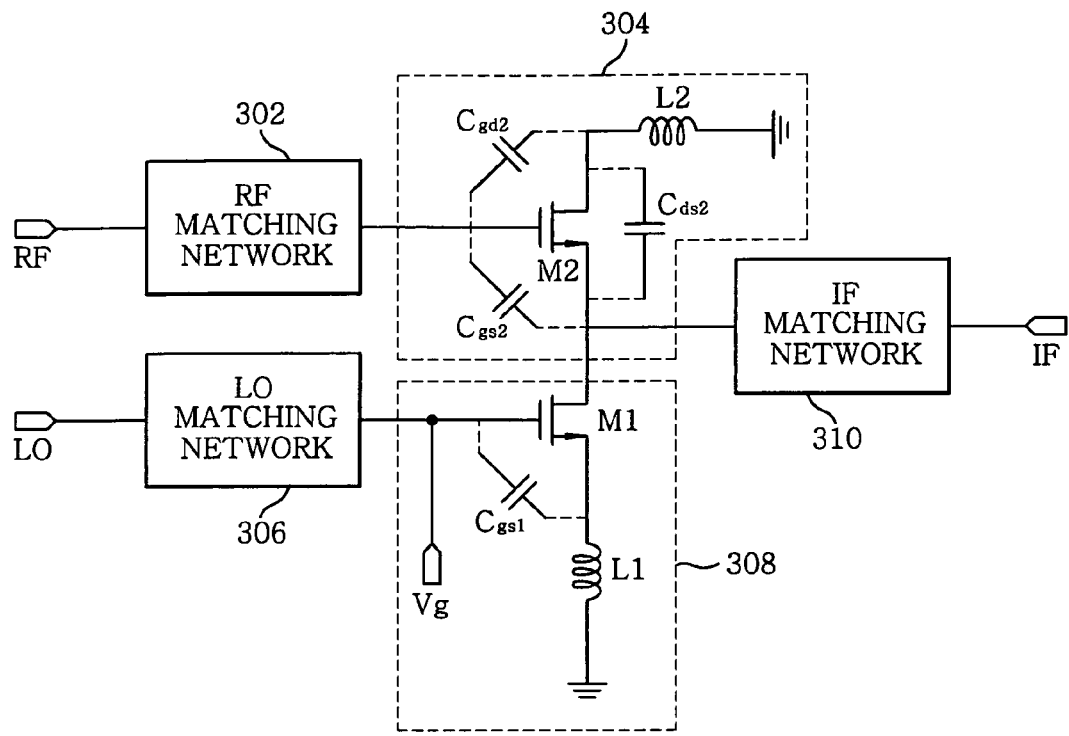
FIG. 3A illustrates a resistive frequency mixing apparatus in accordance with a first embodiment of the present invention.

FIG. 3A illustrates a circuitry diagram of a resistive frequency mixing apparatus in accordance with a first embodiment of the present invention. The resistive frequency mixing apparatus includes an RF matching network 302, a first frequency mixer 304, an LO matching network 306, a second frequency mixer 308, and an IF matching network 310.

As shown in FIG. 3A, the RF matching network 302 is connected to a gate of the first frequency mixer 304. The RF matching network 302 receives an input RF signal through an antenna (not shown) and performs a frequency matching on the input RF signal to produce an RF signal of a specific RF band with no loss. The RF signal of the specific RF band is then provided to the first frequency mixer 304.

The first frequency mixer 304 includes a source follower FET M2. In the first frequency mixer 304, an inductor L2 is connected to a drain of the source follower FET M2 to compensate a capacitance $C_{gd2}$ incurred between a gate and the drain of the source follower FET M2, a capacitance $C_{ds2}$ incurred between the drain and a source of the source follower FET M2, and a capacitance $C_{gs2}$ incurred between the gate and the source of the source follower FET M2 to thereby reduce a conversion loss in the resistive frequency mixing apparatus. In addition, connected to the drain of the source follower FET M2 is the other end of the inductor L2 which is grounded.

The LO matching network 306 is connected to a gate of the second frequency mixer 308. The LO matching network 306 receives an input LO signal through a local oscillator (not shown) and performs a frequency matching of the input LO signal to produce a frequency matched LO signal of a specific LO frequency band with no loss. The frequency matched LO signal is then provided to the second frequency mixer 308. Further, the LO matching network 306 serves to reduce an LO insertion loss, as well as to block DC components and influences of unnecessary signals of a low frequency band.

The second frequency mixer 308 includes a common source FET M1 having a drain connected to the source of the source follower FET M2. In the second frequency mixer 308, an inductor L1 is connected to a source of the common source FET M1 to compensate a capacitance $C_{gs1}$ incurred between a gate and the source of the common source FET M1 to thereby reduce a conversion loss in the resistive frequency mixer. Also, connected to the source of the common source FET M1 is the other end of the inductor L1 which is grounded. In FIG. 3A, Vg represents a gate voltage.

The frequency matched RF signal from the first frequency mixer 304 is down-converted into an intermediate frequency (IF) band depending on the frequency matched LO signal from the second frequency mixer 308, and then applied to the IF matching network 310.

The IF matching network 310 performs a frequency matching of the down-converted IF signal to generate an IF signal of a specific IF band.

Therefore, the resistive frequency mixing apparatus of the present invention enhances LO-RF isolation as well as RF-IF isolation by using the source follower FET only, making it easier to design an RF-IF matching network. Moreover, since the resistive frequency mixing apparatus additionally includes the source follower FET M2 and the inductor L2 only in comparison with the prior art, it is possible to design the resistive frequency mixing apparatus at a remarkably reduced size. Thus, such a resistive frequency mixing apparatus can easily be applied to mobile communication terminals, especially millimeter-wave band mobile communication terminals.

The following is a description of the operation of the resistive frequency mixing apparatus as to how the resistive frequency mixing apparatus having the above configuration performs a series of processes that includes matching an input RF signal, matching an input LO signal, mixing the RF signal and the LO signal being matched through the source follower FET and the common source FET, respectively, and matching such a mixed signal, with reference to FIG. 4.

FIG. 4 illustrates a flowchart describing a method for producing an IF signal through a frequency conversion using a resistive frequency mixing apparatus in accordance with the present invention.

First, in step 402, an RF signal received through an antenna (not shown) is inputted to the RF matching network 302 of the resistive frequency mixing apparatus, and an LO signal provided through a local oscillator (not shown) is applied to the LO matching network 306 of the resistive frequency mixing apparatus.

In step 404, the RF matching network 302 matches the input RF signal and provides the frequency matched RF signal to the first frequency mixer 304 as a signal of a specific RF band without loss. Meanwhile, the LO matching network 306 matches the input LO signal and outputs the frequency matched LO signal to the second frequency mixing block 308 as a signal of a specific LO frequency band.

In step 406, the frequency mixing (or frequency conversion) is carried out on the RF signal inputted to the first frequency mixer 304 depending on the LO signal applied to the second frequency mixer 308, to provide an IF signal down-converted to an IF band to the IF matching network 310.

In step 408, the IF matching network 310 outputs the input IF signal as a signal of a specific IF frequency band.

Figure 5:
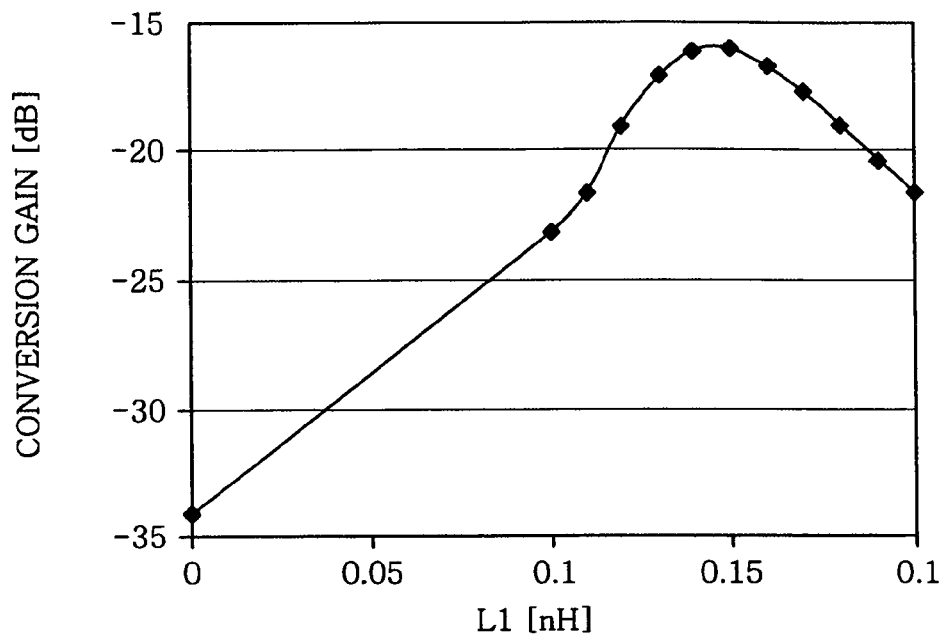
FIG. 5 is a graph showing a down-conversion loss versus a value of an inductor connected to a common source FET, in accordance with the present invention.
Figure 6:
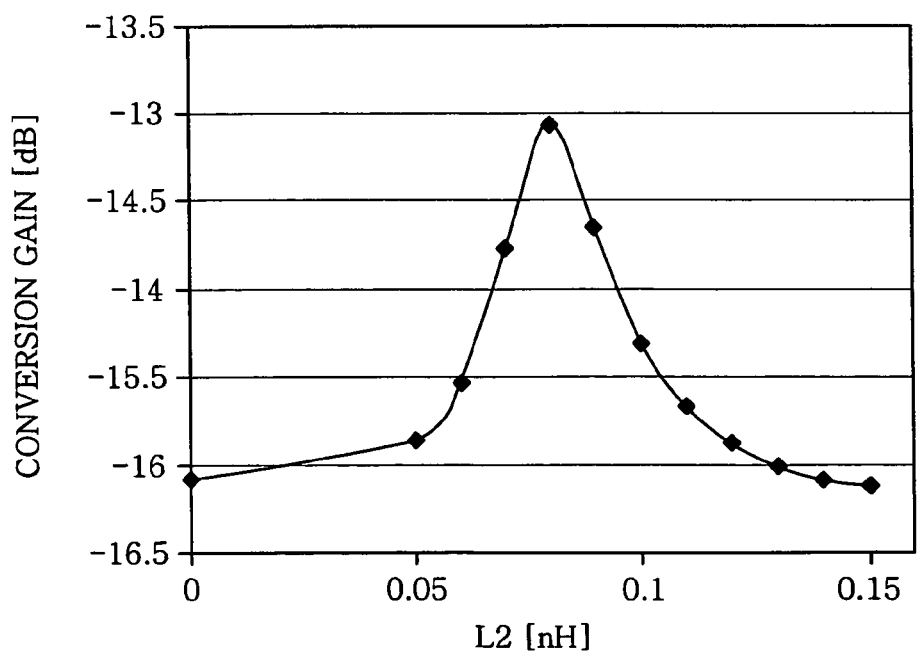
FIG. 6 offers a graph showing a down-conversion loss versus a value of an inductor connected to a common source FET and down-conversion loss versus inductor value connected to a source follower FET, in accordance with the present invention.

FIG. 5 is a graph showing a down-conversion loss versus a value of an inductor connected to a common source FET M1, in accordance with the present invention, and FIG. 6 depicts a graph comparing a down-conversion loss versus a value of an inductor L1 connected to a common source FET M1 with a down-conversion loss versus a value of an inductor L2 connected to the source follower FET M2 in accordance with the present invention.

As can be seen from the graph in FIG. 5, with the application of a resistive frequency mixing apparatus of, e.g., a 60 GHz band, having a source follower CMOS FET with a gate length of 0.13 µm, a conversion loss of −34 dB, which had been acquired, was reduced to a conversion loss of −16 dB through an inductor L1 of about 0.15nH connected to the common source FET M1. In addition, as shown in the graph of FIG. 6, with the application of the resistive frequency mixing apparatus of a 60 GHz band having a source follower CMOS FET with a gate length of 0.13 µm, a conversion loss of −16 dB, which had been acquired through the inductor L1 of 0.15nH connected to the common source FET M1, was cut down to a conversion loss of −14 dB through an inductor L2 of about 0.08nH connected to the source follower FET M2.

Therefore, the use of the resistive frequency mixing apparatus having the common source FET and the source follower FET enhances LO-RF isolation as well as RF-IF isolation by using the source follower FET only, making it easier to design an RF-IF matching network. Further, it is possible that LO frequency is inputted at relatively low LO power, and an IF signal corresponding to an input RF signal is outputted in form of a signal with relatively low conversion loss.

Figure 3B:
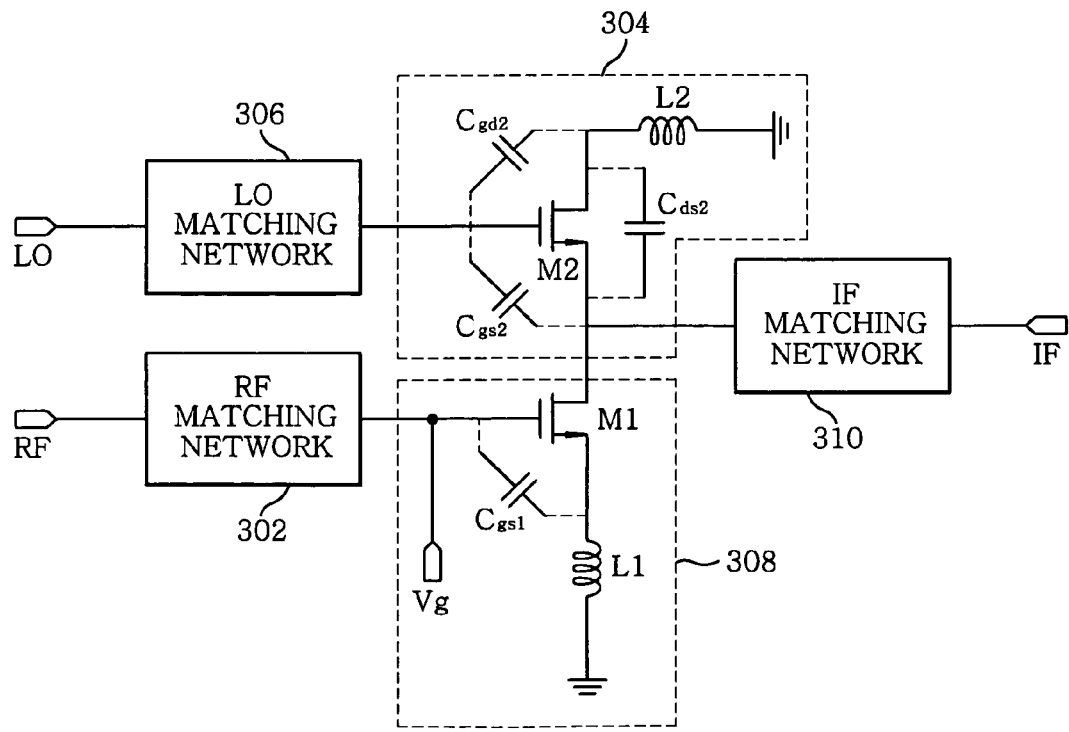
FIG. 3B provides a resistive frequency mixing apparatus in accordance with a second embodiment of the present invention.

As set forth above with reference to FIG. 3A, the resistive frequency mixing apparatus and the signal processing method in accordance with a first embodiment of the present invention have been described in a manner that the first frequency mixer 304 receiving an RF signal is composed of a source follower FET, and the second frequency mixer 308 receiving an LO signal is composed of a common source FET. Alternatively, as shown in FIG. 3B, it is noted that an RF signal is applied to one frequency mixer 308 composed of a common source FET M1, while an LO signal is applied to the other frequency mixer 304 composed of a source follower FET M2 so that these frequency mixers carry out a frequency mixing of the RF and LO signals to generate a down-converted IF signal. In FIG. 3B, one end of a first inductor L1 is connected to a source of the frequency mixer 308 composed of the common source FET M1, and the other end thereof is grounded. And, one end of a second inductor L2 is connected to a drain of the frequency mixer 304 composed of the source follower FET M2, and the other end is grounded.

In addition, the resistive frequency mixing apparatus and the signal processing method in accordance with a first embodiment of the present invention have been described in such a way that an RF signal is inputted to the first frequency mixer 304 and an LO signal is inputted to the second frequency mixer 308 so that the first and the second frequency mixers 304 and 308 perform a frequency mixing to produce a down-converted IF signal. In contrast, it is understood that an IF signal is inputted to a drain of the second frequency mixer 308 and an LO signal may be inputted to a gate of the first frequency mixer 304 so that the first and second frequency mixers 304 and 308 carry out a frequency mixing of the IF and LO signals to produce an up-converted RF signal. This RF signal is then matched with a specific RF band signal by the RF matching network 302 to output a matched RF signal.

Moreover, as shown in FIG. 3B, in case that input port of LO signal are connected to one frequency mixer 304 composed of a source follower FET M2, while input/output ports of RF signal are connected to the other frequency mixer 308 composed of a common source FET M1, it is possible to design that both of an IF signal and an LO signal are applied to the frequency mixer 304 composed of a source follower FET M2, and that the frequency mixer 304 composed of a source follower FET M2 and the frequency mixer 308 composed of a common source FET M1 may carry out a frequency mixing of the IF and LO signals to produce an up-converted RF signal. This RF signal is then matched with a specific RF band signal by the RF matching network 302 to output a matched RF signal.

In this case, as shown in FIG. 3B, one end of a first inductor L1 is connected to a source of the frequency mixer 308 composed of the common source FET M1, and the other end is grounded. And, one end of the second inductor L2 is connected to a drain of the frequency mixer 304 composed of the source follower FET M2, and the other end is grounded.

As described above, unlike a resistive frequency mixing apparatus of the prior art where an input port of RF signal and an output port of IF signal are connected to a drain of the FET or a number of couplers and filters, the resistive frequency mixing apparatus of the present invention includes a first frequency mixer with a source follower FET and a second frequency mixer with a common source FET, so that an RF signal inputted to the source follower FET undergoes a frequency mixing based on an LO signal applied to the common source FET to generate a down-converted IF signal. In this manner, LO-RF isolation as well as RF-IF isolation can be enhanced, making it easier to design an RF-IF matching circuit. Moreover, an IF signal with relatively low conversion loss can be generated even using a relatively low LO power.

While the invention has been shown and described with respect to the preferred embodiments, it will be understood by those skilled in the art that various changes and modification may be made without departing from the scope of the invention as defined in the following claims.

What is claimed is:

1. A resistive frequency mixing apparatus, comprising:
   a first frequency mixer having a source follower FET (Field-Effect Transistor); and
   a second frequency mixer having a common source FET,
   wherein the first and the second frequency mixer are configured to perform a frequency mixing on an RF (Radio Frequency) depending on an LO (Local Oscillation) signal to generate a down-converted IF (Intermediate Frequency) signal when the RF signal is applied to one of the source follower FET and the common source FET and the LO signal is applied to another one of the source follower FET and the common source FET, and
   wherein a DC (Direct Current) bias is applied to none of drains of the source follower FET and the common source FET.

2. The resistive frequency mixing apparatus of claim 1, wherein the first frequency mixer includes a first inductor whose one end is connected to the drain of the source follower FET to compensate capacitances produced between a gate and the drain, between the gate and a source, and between the drain and the source of the source follower FET, respectively, and the other end of the first inductor connected to the drain of the source follower FET is grounded.

3. The resistive frequency mixing apparatus of claim 1, wherein the second frequency mixer includes a second inductor whose one end is connected to a source of the common source FET to compensate a capacitance produced between a gate and the source of the common source FET, and the other end of the second inductor connected to the source of the common source FET is grounded.

4. The resistive frequency mixing apparatus of claim 2, wherein the second frequency mixer includes a second inductor whose one end is connected to a source of the common source FET to compensate a capacitance produced between a gate and the source of the common source FET, and the other end of the second inductor connected to the source of the common source FET is grounded.

5. A resistive frequency mixing apparatus, comprising:
   a first frequency mixer having a common source FET (Field-Effect Transistor); and
   a second frequency mixer having a source follower FET,
   wherein the first and the second frequency mixer is configured to perform a frequency mixing of an IF (Intermediate Frequency) signal depending on an LO (Local Oscillation) signal through the use of one of the source follower FET and the common source FET to output an up-converted RF (Radio Frequency) signal when the IF signal and the LO signal are applied to another one of the source follower FET and the common source FET, and
   wherein a DC (Direct Current) bias is applied to none of drains of the source follower FET and the common source FET.

6. The resistive frequency mixing apparatus of claim 5, wherein the first frequency mixer includes a first inductor whose one end is connected to a source of the common source FET to compensate a capacitance produced between a gate and the source of the common source FET, and the other end of the first inductor connected to the source of the common source FET is grounded.

7. The resistive frequency mixing apparatus of claim 5, wherein the second frequency mixer includes a second inductor whose one end is connected to the drain of the source follower FET to compensate capacitances produced between a gate and the drain, between the gate and a source, and between the drain and the source of the source follower FET, respectively, and the other end of the second inductor connected to the drain of the source follower FET is grounded.

8. The resistive frequency mixing apparatus of claim 6, wherein the second frequency mixer includes a second inductor whose one end is connected to the drain of the source follower FET to compensate capacitances produced between a gate and the drain, between the gate and a source, and between the drain and the source of the source follower FET, respectively, and the other end of the second inductor connected to the drain of the source follower FET is grounded.

9. A signal processing method for use in a resistive frequency mixing apparatus including a first frequency mixer having a source follower FET (Field-Effect Transistor), and a second frequency mixer having a common source FET, the method comprising the steps of:
   frequency matching an input RF (Radio Frequency) signal and an input LO (Local Oscillation) signal, respectively;
   performing a frequency mixing of the frequency matched RF signal depending on the frequency matched LO signal to generate a down-converted IF (Intermediate Frequency) signal applying the frequency matched RF signal to one of the source follower FET and the common source FET and the frequency matched LO signal to another one of the source follower FET and the common source FET,
   wherein a DC (Direct Current) bias is applied to none of drains of the source follower FET and the common source FET.

10. The method of claim 9, wherein performing the frequency mixing of the frequency matched RF signal includes compensating capacitances incurred between a gate and the drain, between the gate and a source, and between the drain and the source of the source follower FET.

11. The method of claim 9, wherein carrying out the frequency mixing of the frequency matched RF signal includes compensating a capacitance produced between a gate and the source of the common source FET.

12. The method of claim 10, wherein performing a frequency mixing of the frequency matched RF signal includes compensating a capacitance incurred between a gate and the source of the common source FET.

13. A signal processing method for use in a resistive frequency mixing apparatus including a first frequency mixer having a common source FET (Field-Effect Transistor), and a second frequency mixer having a source follower FET, the method comprising the steps of:
   frequency matching an input IF (Intermediate Frequency) signal and an input LO (Local Oscillation) signal, respectively;
   performing a frequency mixing of the frequency matched IF signal and the frequency matched LO signal by one of the source follower FET and the common source FET to generate an up-converted RF (Radio Frequency) signal by applying the IF signal and the LO signal to another one of the source follower FET and the common source FET;
   wherein a DC (Direct Current) bias is applied to none of drains of the source follower FET and the common source FET.

14. The method of claim 13, wherein performing the frequency mixing of the frequency matched IF signal and the frequency matched LO signal includes compensating capacitances produced between a gate and the drain, between the gate and a source, and between the drain and the source of the source follower FET.

15. The method of claim 13, wherein carrying out the frequency mixing of the frequency matched IF signal and the frequency matched LO signal includes compensating a capacitance incurred between a gate and the source of the common source FET.

16. The method of claim 14, wherein carrying out the frequency mixing of the frequency matched IF signal and the frequency matched LO signal includes compensating a capacitance incurred between a gate and the source of the common source FET.

* * * * *